United States Patent
Sinistro et al.

(10) Patent No.: US 9,515,459 B2
(45) Date of Patent: Dec. 6, 2016

(54) POWER SUPPLY MODULE FOR MODULAR TELECONTROL EQUIPMENT AND EQUIPMENT COMPRISING SAME

(71) Applicant: Schneider Electric Industries SAS, Rueil Malmaison (FR)

(72) Inventors: Stephane Sinistro, Lyons (FR); Christophe Mollier, Villeurbanne (FR); Eric Suptitz, Montaud (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 14/736,797

(22) Filed: Jun. 11, 2015

(65) Prior Publication Data

US 2016/0006223 A1 Jan. 7, 2016

(30) Foreign Application Priority Data

Jul. 2, 2014 (FR) ...................................... 14 56312

(51) Int. Cl.
*H02B 1/32* (2006.01)
*H02B 1/38* (2006.01)
(Continued)

(52) U.S. Cl.
CPC ................ *H02B 1/32* (2013.01); *H02B 1/041* (2013.01); *H02B 1/052* (2013.01); *H02B 1/38* (2013.01); *H02B 7/06* (2013.01); *H02J 13/0017* (2013.01);
(Continued)

(58) Field of Classification Search
CPC .......... H02B 1/32; H02B 1/38; H02B 1/041; H02B 7/06; H05K 5/00; H02J 13/0079; H02J 13/00; Y02B 90/2607; H02H 3/16
USPC ............ 361/2, 42, 44, 65, 206, 679.01, 620, 361/622, 623, 715, 723; 340/635, 649, 650, 340/657; 307/24, 31, 64, 85, 112; 174/50, 174/50.02, 520; 348/211.4, 211.99, 211.1, 348/211.2
See application file for complete search history.

(56) References Cited

U.S. PATENT DOCUMENTS 4,652,769 A * 3/1987 Smith ................. H02M 3/3376
307/24
5,528,131 A * 6/1996 Marty .................... H01H 9/542
323/238

(Continued)

OTHER PUBLICATIONS

French Preliminary Report issued May 4, 2015 in Patent Application No. 1456312 (with English translation of categories of cited documents).

(Continued)

*Primary Examiner* — Michail V Datskovskiy
(74) *Attorney, Agent, or Firm* — Oblon, McClelland, Maier & Neustadt, L.L.P.

(57) ABSTRACT

A power supply module for intelligent electronic apparatuses and capable of transforming the energy of the LV network and of a battery into energy that can be used by said apparatuses is produced to serve as support for said apparatuses. In particular, for a use in a telecontrol equipment item, the casing of the power supply module is flat, can be installed on wall-mounted DIN rails, and includes, on its front face, a DIN rail for fixing the apparatuses that it powers, that is to say other functional modules of the equipment. The casing also includes an apron for the connections. Preferably, the power supply is produced by series connection, and the power supply module includes a port dedicated to external communication via a module of the equipment.

13 Claims, 8 Drawing Sheets

(51) Int. Cl.
  *H02B 1/052* (2006.01)
  *H02B 7/06* (2006.01)
  *H02J 13/00* (2006.01)
  *H02B 1/04* (2006.01)

(52) U.S. Cl.
  CPC ........ *H02J 13/0079* (2013.01); *Y02B 90/2607* (2013.01); *Y02E 60/723* (2013.01); *Y04S 10/16* (2013.01); *Y04S 40/12* (2013.01)

(56) References Cited

U.S. PATENT DOCUMENTS

| | | | | |
|---|---|---|---|---|
| 7,400,348 | B2* | 7/2008 | Hoyos | G05D 1/0038 348/211.4 |
| 8,050,016 | B2* | 11/2011 | Haug | B66C 13/40 361/679.01 |
| 8,537,021 | B1* | 9/2013 | Gordin | H02H 3/162 340/635 |
| 8,773,827 | B2* | 7/2014 | Kiko | H02J 3/14 361/2 |
| 2008/0100975 | A1* | 5/2008 | Myoung | H02H 3/00 361/65 |

OTHER PUBLICATIONS

Bernd Schüpferling, et al., "Intelligent transformer substations in modern medium voltage networks as part of "smart grid"", 21st International Conference on Electricity Distribution, XP055173123, Jun. 9, 2011, pp. 1-4.

"RTU and special electronics" Retrieved from Internet: http://www.elvac.eu/ipc/download/ELVAC-IPC-RTU-EN.pdf, XP002739189, Jun. 20, 2014, pp. 1-72 and Cover Pages.

"RTU560 product line" Retrieved from Internet: https://web.archive.org/web/20140630095421/http://www05.abb.com/global/scot/scot258.nsf/veritydisplay/b9ede8641147035cc1257b26004042d1/$file/2013-03-06-RTU560-product-line.pdf, XP002739190, Jun. 30, 2014, 2 Pages.

"RTU and PLC uninterruptible power supply systems" Retrieved from Internet: http://solarcraft.net/media/files/files/267ba336/RTU-PLC-UPS.pdf, XP002739191, Apr. 30, 2014, 2 Pages.

* cited by examiner

POWER SUPPLY MODULE FOR MODULAR TELECONTROL EQUIPMENT AND EQUIPMENT COMPRISING SAME

TECHNICAL FIELD

The invention relates to the architecture governing the arrangement of the various components of a switch remote control interface. In particular, the invention relates to a design of the power supply module of a telecontrol equipment item which allows the arrangement of the other components, notably in the form of functional modules, to be optimized. The invention relates also to a telecontrol equipment item comprising the power supply module onto which communication and monitoring or control/command modules

STATE OF THE ART

The electrical networks 1 are generally designed with a multi-level architecture, with a first network for transporting and distributing very high and high voltages from the power stations over great distances. It is followed by an HVA or MV medium-voltage distribution network 3 for smaller scale transport, to clients of industrial type or to low-voltage LV networks 4 which supply power to clients with low energy demand (see also FIG. 1A).

At the distribution network 3 level, usually between 1 and 35 kV, and more specifically 15 or 20 kV in France, it is usual for the HVA switchgear 5 to be able to be remotely controlled from remote stations 6, conventionally at MV/LV transformer substations. Thus, Electricité de France (EdF) uses 400 A switch remote control interfaces 10, or ITI, to control up to eight switches 5 by using the GPRS (General Packet Radio Service) analogue or digital radio network, the public switched telephone network PSTN, a dedicated telephone link (or leased link LS), or other types of computer networks.

An ITI 10, directly powered on the LV AC network 4, therefore allows telecommunication with the network control station 6, manoeuvring of the electrical controls of the switches 5, detection of HVA faults, automatic opening of a switch 5 upon detection of the faulty feeder, automatic switchover of power sources, recording of manoeuvres and signalling of date-stamped events. Furthermore, the ITI 10 must ensure these so-called main functions in the event of loss of the AC power source; to this end, it comprises a stand alone power source which takes over from the usual external AC source.

More generally, this so-called "telecontrol" type of equipment 10, or FRTU (Feeder Automation Remote Terminal Unit) is located at the MV/LV substations 6 and ensures measurement, communication and control functions, being linked downstream to sensors 7, and upstream to a remote management supervisor 8 of SCADA (Supervisory Control And Data Acquisition) type.

Specifications govern the constituent elements of the telecontrol equipment, which can vary notably because of the environment of the network (underground/overhead), its density (number of feeders to be monitored), its earthing, communication possibilities (radio, GSM, etc.), specific features of the sensors or footprint constraints, not counting the local normative requirements. It thus appears desirable to have a modular offering making it possible to construct the telecontrol equipment 10 to best meet the needs of the client, which, among other things, facilitates the technical management and the logistics, while allowing for possible adaptation. It then appears desirable to facilitate the connections between the modules of such an offering.

Moreover, the insertion of decentralized production means, with photovoltaic panels, wind farms and small power stations, in the LV networks 4 and the MV networks 3 considerably increases their complexity, with a two-way and non-constant energy distribution whose parametric fluctuations should be managed. In particular, in addition to the MV 3 fault detection and control functions, it would be desirable to extend the functionalities of an FRTU 10 to the management of the medium voltage 3 voltage plan and the management of the LV network 4.

EXPLANATION OF THE INVENTION

Among other advantages, the invention aims to propose a specific configuration of one of the modules of a telecontrol equipment item, the power supply, so as to offer an optimized modular architecture.

Under one of its aspects, the invention relates to a power supply module, or power plant, for a telecontrol equipment item, the casing of which is adapted to serve as support for electronic apparatuses that it powers. The power supply module comprises electronic power supply means, in particular a printed circuit board, which notably comprise means for connection to a low voltage network and to a battery as auxiliary source, means for transforming the energy from the sources to which the module can be connected to power supply energy for electronic apparatuses, and means for connection to electronic apparatuses to power them, as well as, possibly, a communication port and/or display means of light-emitting diode type.

The electronic power supply means are housed in a casing of the module which comprises a support face, notably metal, intended to be fixed onto a wall mount, for example using appropriate means for fixing to DIN rails, such as snap-fitting means on one rail and locking means on a parallel rail; the printed circuit board is preferably installed parallel to the support face.

Part of the casing is closed by a cap, preferably insulating, comprising orifices from which the connection and display means are accessible, and the other part is closed by a cover, advantageously metal, having a front face opposite the support face which is provided with fixing means for powered electronic apparatuses, notably a DIN rail; insulation means can then be provided to insulate the electronic means from the casing. Ventilation louvers are preferably provided on two side walls of the cover to allow a natural cooling convection.

Under another aspect, the invention relates to a telecontrol equipment item whose power supply is ensured by such a module. The telecontrol equipment item thus further comprises at least one module for monitoring a medium voltage network. The equipment item can also comprise a communication module, also installed, via the fixing means, on the front face of the power supply module to which it is connected by the connection means, the communication module being linked to the monitoring module in such a way that the link between the monitoring module and the power supply module is in "daisy chain" form via the communication module. Advantageously, the power supply module and the communication module are further linked via a communication port.

BRIEF DESCRIPTION OF THE FIGURES

Other advantages and features will emerge more clearly from the following description of particular embodiments of the invention, given in such a way as to be illustrative and nonlimiting, represented in the attached figures.

DETAILED DESCRIPTION OF A PREFERRED EMBODIMENT

To simplify the description, the various elements will be described in relation to a position of use of the equipment item 10, mounted in a cabinet 20 at the MV/LV substation 6 on a vertical wall. It is however understood that the position terms such as "horizontal", "lateral", "bottom" are in no way restrictive as to the object of the invention. Moreover, the geometrical terms, such as "orthogonal", etc., should be understood in their accepted mechanical terms, that is to say tolerating a deviation from the strict mathematical definition: for example, a "rectangle" can, according to the invention, be rounded and have softened angles differing slightly from 90°.

Figure 1A:
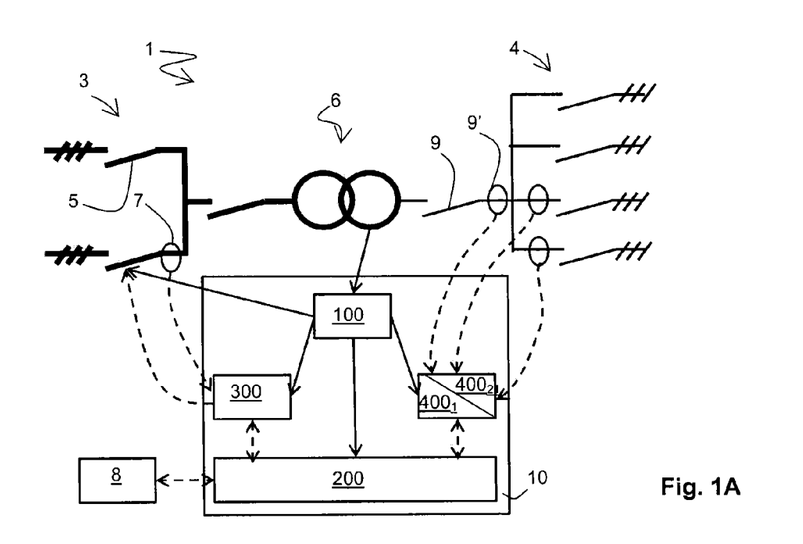
FIGS. 1A and 1B schematically illustrate a telecontrol equipment item according to a preferred embodiment of the invention and its location in an electrical network.

As illustrated in FIG. 1A, a telecontrol equipment item 10 comprises a first module 100 intended for its power supply, a second module 200 serving as communication interface and at least one third module 300 intended for the monitoring, or control/command, of the medium voltage MV network 3. Furthermore, the equipment item 10 can comprise at least one fourth module 400$_i$ intended to monitor the low voltage LV network 4, using the same communication module 200 as the MV monitoring module(s) 300$_i$. According to the preferred embodiment of the invention, each module 100, 200, 300, 400 is formed by an individual casing housing the functional elements and can thus be separated from the others, for example for replacement; the modules 100, 200, 300, 400 are linked together with appropriate means to ensure the communication and the supply of energy.

Figure 1B:
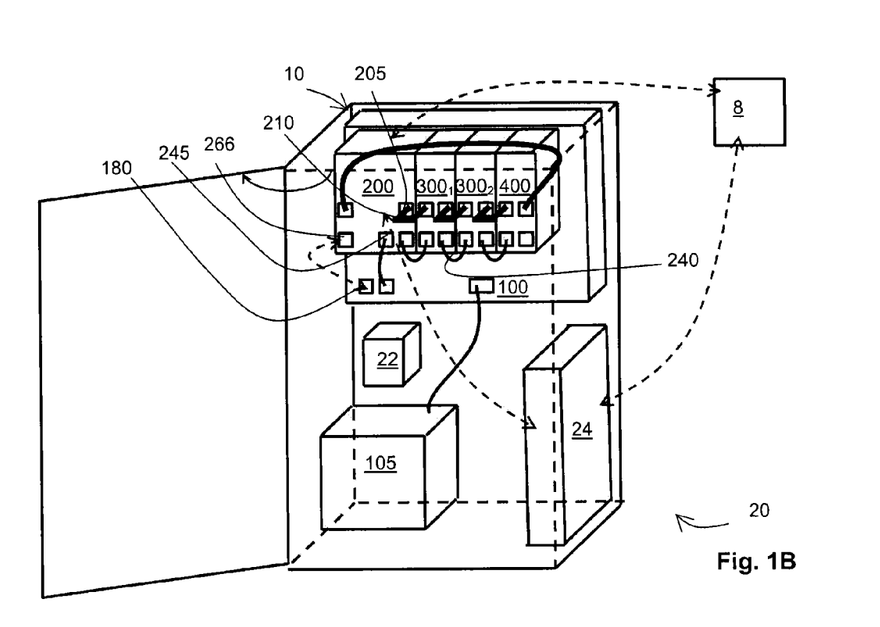

The telecontrol equipment item 10 is, as also illustrated in FIG. 1B, conventionally installed in a dedicated cabinet 20, even though other options are possible. A cabinet 20 is partially standardized notably with respect to its dimensions and the elements that it has to house, said elements for their part imposing certain relative insulation constraints: see for example the Patent Application FR 13 56645. In particular, the cabinet 20 houses a battery 105, usually at the bottom of the cabinet for weight reasons, a fuse-holder 22, an external communication of radio type 24, and the telecontrol equipment item 10.

Advantageously, the telecontrol equipment item 10 is located at the top of the cabinet 20 and forms a row, the communication 200 and monitoring 300, 400 modules notably being aligned side by side. Preferably, the profiles of the aligned modules are similar to form a coherent assembly, with a width that is identical or a multiple of a fixed pitch, so as to facilitate their assembly, the running of the cables, the connections, as well as the access to and display of the interfaces.

In a preferred embodiment, the communication module 200 is located at one end of the alignment, for example to facilitate its connections to the external management systems 8 such as a SCADA station. Since the communication module 200 has to be functionally linked to the other modules 100, 300, 400 of the FRTU 10, and in order to simplify these connections, it is preferable to use a series connection or connection of "daisy chain" type, that is to say that the transmission of information for the communication is done step by step from the communication module 200, via appropriate means 210, for example a connection system preferably of RJ45 type. This solution offers the additional advantage of the possibility of adding/removing monitoring modules 300$_i$, 400$_i$ without a limit. In the preferred embodiment in which the monitoring 300$_i$, 400$_i$ and communication 200 modules are placed side by side, it is advantageous for the connection terminals 205 of each module 200, 300, 400 to be placed at an identical distance from the edge of their casing, so that the distance separating them is constant, for example 26 mm. Thus, it is possible to provide appropriate connection means 210, of which the two connectors 212 are linked by an optimized length of copper which further offers an external appearance without any dangling cables.

Figure 2A:
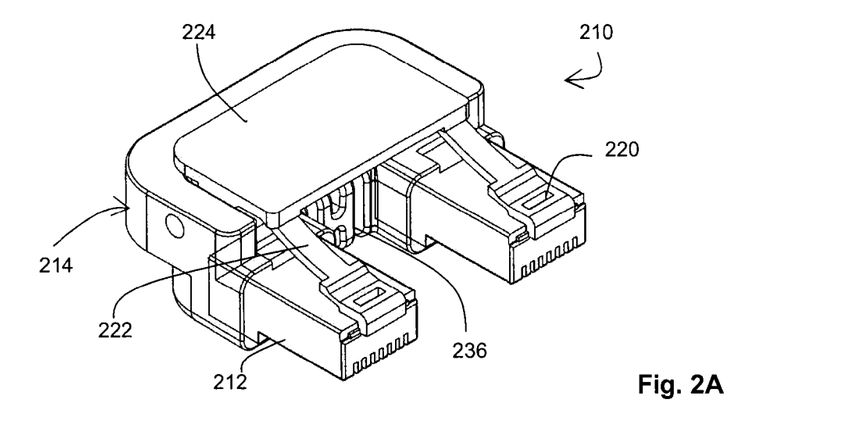
FIGS. 2A and 2B represent a connection jumper.
Figure 2B:
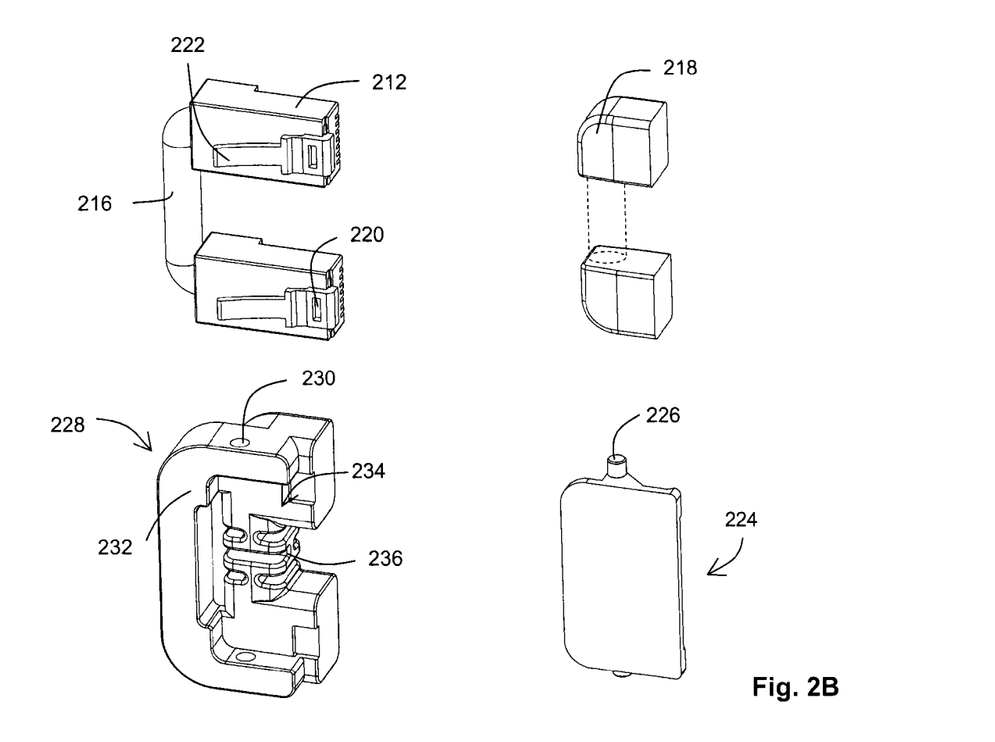

In a preferred embodiment illustrated in FIG. 2, the connection system 210 for daisy-chain connection is rigid, in the form of jumpers. The two connectors 212 are thus linked by a U-shaped base 214, notably comprising a sheathed cable core 216, notably 8 strands if the connectors 212 are RJ45 terminals. To minimize the size of the connection system 210, the bending radius of the cable 216 is increased, and collectors 218 are fitted at the end of each connector 212 in order to protect said cable 216 which leans on its edge.

As indicated, the RJ45-type Ethernet connection is most appropriate for the transmission of information within a modular telecontrol equipment item 10. The choice of minimizing the length of cable 216 does however generate difficulties in the handling of the male Ethernet ports 212 which comprise a latch 220 and a tab 222 to be pushed upon extraction in particular. According to the preferred embodiment, the two connectors 212 are therefore placed parallel to one another, with their tab 222 on the same side of the connection system 210, and a pushbutton 224 is fitted to actuate the two tabs 222 at the same time. The pushbutton 224 is preferably mobilized by pivoting about an axis, which is advantageously formed integrally with the pushbutton 224 by extending a plate with two studs 226. The pushbutton 224 cooperates with an overmoulding 228 of the U-shaped part.

In fact, the assembly formed by the end of the connectors 212, the cable 216 and the collectors 218 is overmoulded with plastic, the overmoulding 228 being provided with two eyelets 230, emergent or not, to accommodate the studs 226 of the pushbutton 224. In the absence of any stresses, the pushbutton 224 is adjacent to the tabs 222 of the Ethernet ports 212 without pressing thereon; preferably, a part of the pushbutton 224 rests on a surface 232 formed in the overmoulding, the overmoulding 228 thereby forming a void 234 under the other part of the pushbutton 224, situated on the other side of the axis 226. A pressure on the pushbutton 224 on the side of the void 234 results in a pivoting about the axis 226 such that said part of the pushbutton 224, adjacent to the tabs 222, comes to press simultaneously and identically on the two tabs 222 to release the mechanical latches 220 of the RJ45 connectors, in order to insert or extract the jumper 210 from the adjacent modules between which it ensures the link. The operation is thus carried out in a single step and with only one hand.

Preferably, the overmoulded part 228 of the connection system 210 comprises means for making it partially flexible, notably a bellows 236. This flexibility makes it possible for example to easily insert the studs 226 in the eyelets 230 when assembling the jumper 210, and possibly adjust the connectors 212 upon their insertion into the terminals 205 of the modules to accept a slight offset of level or of spacing between the modules 200, 300, 400 side by side.

The connection system 210 offers the major advantage of its ease of implementation for the connection/disconnection of the modules to and from one another because of the simultaneous actuation of the two connection tabs 222. Furthermore, the configuration makes it possible to limit the footprint due to the connection between modules 200, 300, 400 while allowing a good view of the actual connection. It is however understood that other types of connection can be used for this daisy-chain connection of the FRTU 10.

Each of the monitoring $300_i$, $400_i$ and communication 200 modules is moreover linked to the power supply module 100 for the supply of energy. The power supply module 100 of the telecontrol equipment item 10 can be adapted to serve as power plant, designed for the control and command of all of the substation 6, including the motorization of the MV 5, even LV 9, switches. As for any telecontrol equipment item, the power plant 100 is designed to be powered on the LV network 4 and on a battery 105 that it is able to monitor (level of charge, temperature, etc.), notably when the main network has a fault, to simultaneously supply a number of voltage levels, to power the different functions of the FRTU 10 (communication, measurements, controls of the motorized switches 5), etc.: electronic means, preferably in printed circuit board form, form the corresponding functional part of the power plant 100.

Given the volume and weight constraints of such a power plant 100, notably for high power level imposing minimum dimensions for the transformers, the radiators, etc., one challenge to be met is the incorporation in the restricted volume imposed by certain prescribers for the cabinets 20 housing the apparatuses necessary for the telecontrol. According to the invention, a solution other than the known alternatives (independent solid power supply block, management board associated with a battery housing, or low-power module added on DIN rail as in the iRIO range) has been developed, in order to satisfy the mechanical (maximum dimensions of the enclosure of the FRTU 10), thermal (overheating issues) and electromagnetic (coexistence of electronic signals of different levels and at different frequencies) constraints while being incorporated in the modular offering 10 developed.

Thus, as schematically represented in FIG. 1B, the power supply module 100 according to the preferred embodiment of the invention is designed to serve as support in the alignment of the communication 200 and monitoring 300, 400 modules: the power supply module 100 is flat, placed parallel to the wall mount, for example fixed via one or more DIN rails, and its casing 110 comprises, on the front face, means intended to support the other modules 200, 300, 400 of the telecontrol equipment item 10. Notably, the power supply module 100 has a thickness less than 85 mm, for example 70-74 mm+7 mm of fixing rail, for an occupied wall area less than 200 mm×300 mm, for example 190×270 ($\pm 1$) mm$^2$. Thus, the loss of space is minimized, the mechanical constraints for maintaining the power plant 100 are low, the distribution of the voltage levels is facilitated and unlimited.

Moreover, in order to guarantee a good visibility of its human/machine interface and a good accessibility to the other connection systems, the power plant 100 comprises a functional interface apron 112, for example located at the bottom of the casing 110. To increase the modularity and reduce the connections, the power supply of the modules 200, 300, 400 of the FRTU 10 is also produced step by step, via a daisy-chain, similar to the transmission of information between said modules: only one of the modules, preferably the communication head module 200, is powered via a connection on the functional apron 112, the others being via a connection system which can be coupled to the data transmission connection system or, preferably, separated with dedicated power supply cables 240, possibly in the form of jumpers if the power supply terminals 245 meet spacing criteria similar to those described for the transmission terminals 205.

Figure 3A:
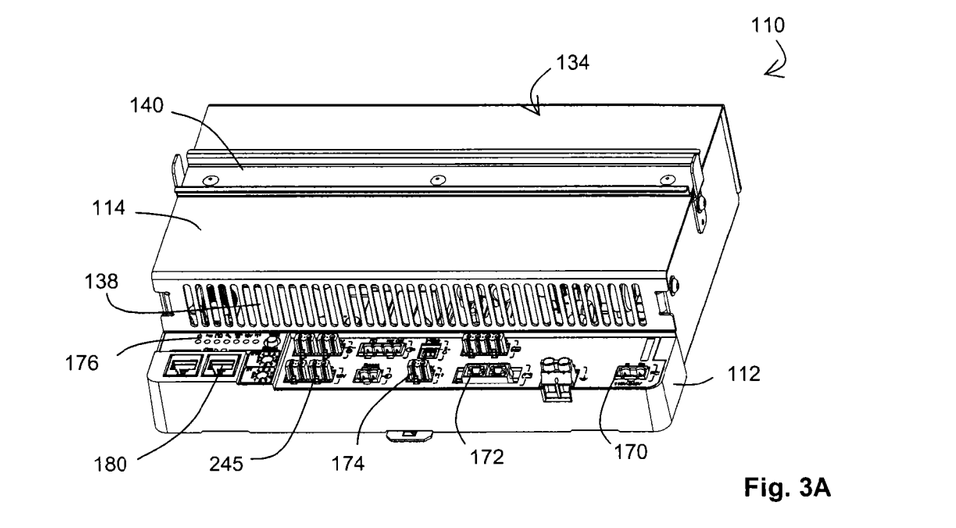
FIGS. 3A, 3B and 3C show the different elements for a power plant of a telecontrol equipment item according to a preferred embodiment of the invention.
Figure 3B:
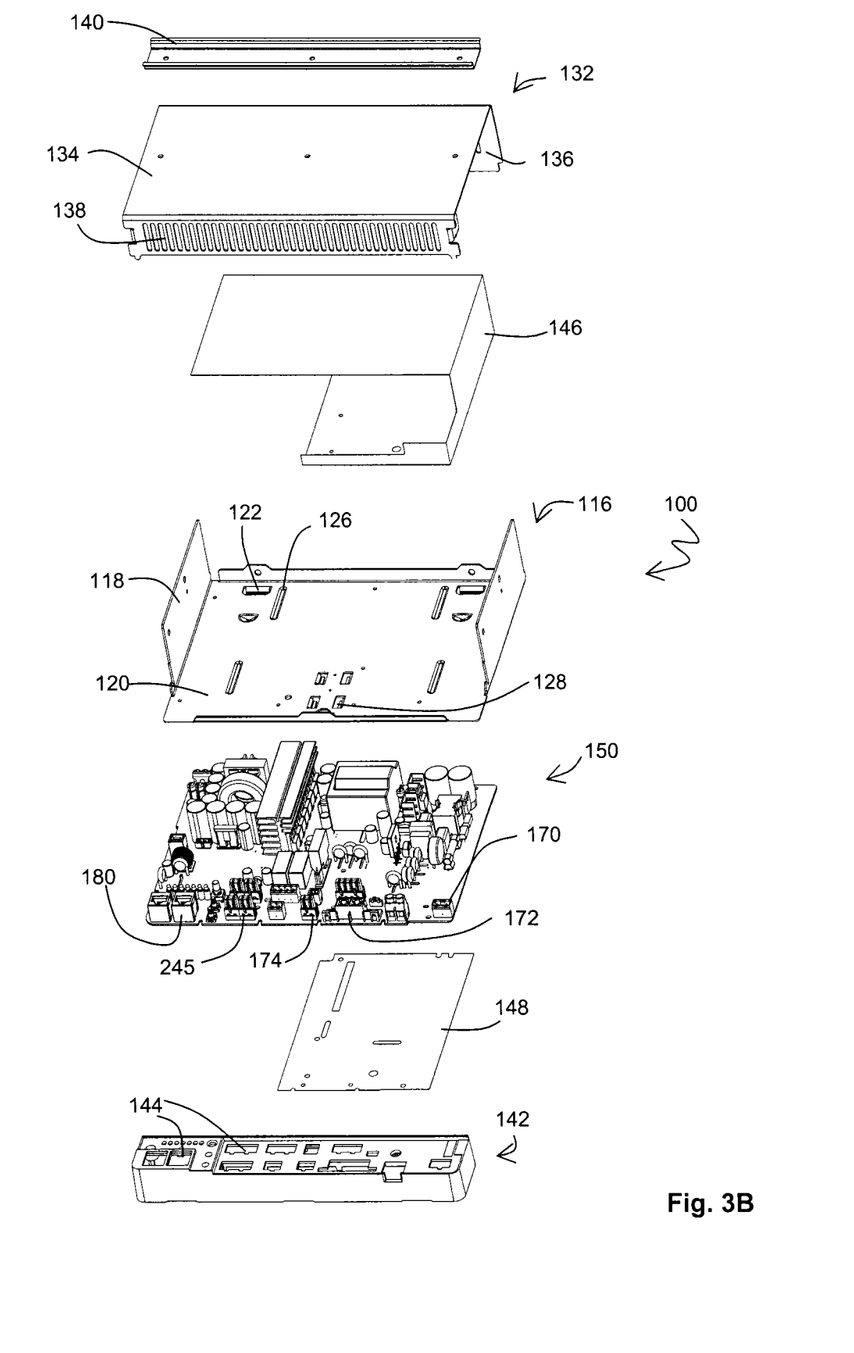
Figure 3C:
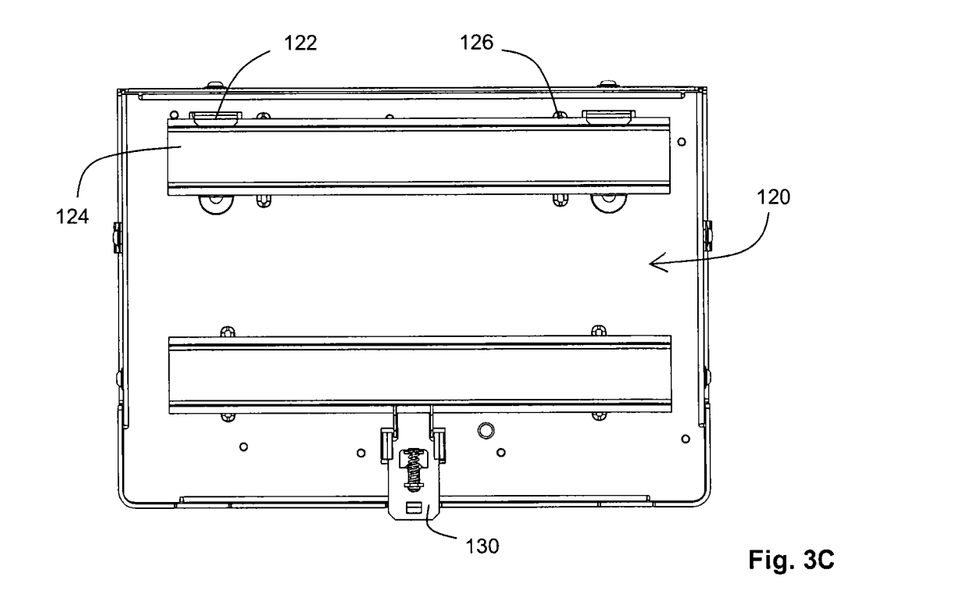

In a preferred embodiment represented in FIG. 3, the power supply module 100 thus comprises a casing 110 in two parts with, in addition to the functional apron 112, a substantially rectangular parallelepipedal main housing part 114. The casing comprises a base 116, advantageously a folded steel plate, forming the side walls 118 of the main housing part 114 and the rear face 120 of the module 100. Said rear face 120 is intended to be fixed onto a vertical wall, for example of the cabinet 20, and advantageously comprises stamped parts 122 which make it possible to be hooked onto a DIN rail 124, preferably onto two horizontal DIN rails present on the wall mount; advantageously, bosses 126 are also formed in order to be pressed onto said rails 124 to allow a positioning parallel to the wall, and/or orifices 128 are adapted to accommodate a locking 130 onto at least one of the DIN rails 124.

The casing 110 is closed by a first cover 132, notably of folded steel plate, forming the front face 134 accommodating the other modules 200, 300, 400 and the top and bottom faces 136 of the main housing part 114. The top and bottom faces 136 are each provided with ventilation louvers 138, which optimizes the natural convection and the cooling of the power supply components housed in the casing 110; the front face 134 is provided with means for fixing the other modules 200, 300, 400 of the equipment item 100, advantageously a DIN rail 140.

The casing 110 at the level of the functional interface apron 112 is closed by a second cap 142 provided with orifices 144 necessary for the fitting of the connectors and display elements of the human/machine interface; given this configuration, it is understood that the bottom face of the first cap 132 is narrower than the top face. The second cap 142 is advantageously made of insulating or plastic material in order to guarantee the insulation at the connector level.

The casing 110 houses the means for transforming the energy received by the module 100, in the form of a printed circuit which is insulated from the metal cap 132 by appropriate means, notably a bottom insulator 146 lining three walls of the casing 110 and an intermediate insulator 148 increasing the insulation distances, advantageously made of plastic. Preferably, the means necessary to ensure the operation of the power plant 100 are in the form of a single printed circuit board 150 which will be placed parallel to the bottom of the base 120 of the telecontrol equipment item 10, all the functional elements being located on one and the same surface of said board 150 which limits the mechanical and production constraints; the single-board electronics moreover allows for a simpler management of the component references and of their layout plan.

The board 150 bears the various means needed to ensure the operation of the power supply module 100, as well as elements ensuring preferred functions, notably for the control of the parameters. In particular, the board 150 comprises an LV isolating transformer, a rectifying and conversion circuit to supply a 12 V DC voltage from the 220 V AC, and a circuit for charging the battery 105. Furthermore, as required, the board 150 comprises circuits for measuring and controlling the input and output currents and voltages. Advantageously, the board 150 also comprises a supervision microprocessor and a charger circuit making it possible to supply a different current, notably to the MV switches 5, as well as means suitable for monitoring the battery as well as heat sinks or other cooling elements.

These elements are complemented by their access at the level of the interface cap 142 by:
- means 170 for connection to an LV power supply, notably single phase;
- means 172 for connection to a battery 105;
- connection means 245 for distributing the power supply, notably 12 V, to intelligent electronic devices, or TED, here the other modules of the equipment item, and in particular the communication module 200;
- connection means 174 for powering, notably at 12 V, standardized communication equipment, such as a radio 24;
- connection means for another power supply, notably 24 or 48 V, for example for the motorization of the MV switches 5;
- connectors to sensors, for example a temperature probe;
- connectors to inputs/outputs;
- dedicated connection means for a battery test on external load;
- addressing means, for example by encoder wheel;
- light-emitting diodes 176 for indicating status (battery, connection of a module to one of the connectors, etc.).

In particular, the power supply module comprises a port 180 dedicated to communication directly with the communication module 200, notably a connector for Modbus link, which can, for example, allow an updating of the monitoring/control processors; depending on whether or not the power supply module 100 is incorporated in the communication loop 210, another RJ45 communication terminal 205 may be provided.

The power supply module 100 is thus flat, serving as mechanical support for the other functions. The fixing on the rear face onto two parallel DIN rails 130, one by hooking, the other by latching, makes it possible to mount and unmount the power plant 100 on and from its support with no specific tool. Furthermore, the presence of louvers 138 at the top and bottom of the cap 132 allows for a natural convection of the power plant 100, without fan, while guaranteeing the IP2x protection index. Depending on the level of insulation by the application, the prescriber, the country, etc., the rear face 120 of the power supply module 100 may be used to exploit the equipment item as heat dissipater through the use of a heat seal.

The arrangement of the communication 200 and monitoring 300, 400 modules on the DIN rail 140 on the front face, and the connection system apron 112 of the power plant 100 allow for simplified connections, that can be easily accessed and seen, by concentrating all the connection systems in the bottom part of the power supply. Since, in all cases, the modules 200, 300, 400 require a power supply, the fact that the latter mechanically supports them facilitates their integration by defining a common architecture, including if the daisy-chain option is not retained. The superpositioning of the modules 200, 300, 400 on the power supply 100 depthwise in the cabinet makes it possible to save space by comparison with the usual solutions, given the use of the depth, the dimension that is least used and which makes it possible to save on the functional volume.

Figure 4:
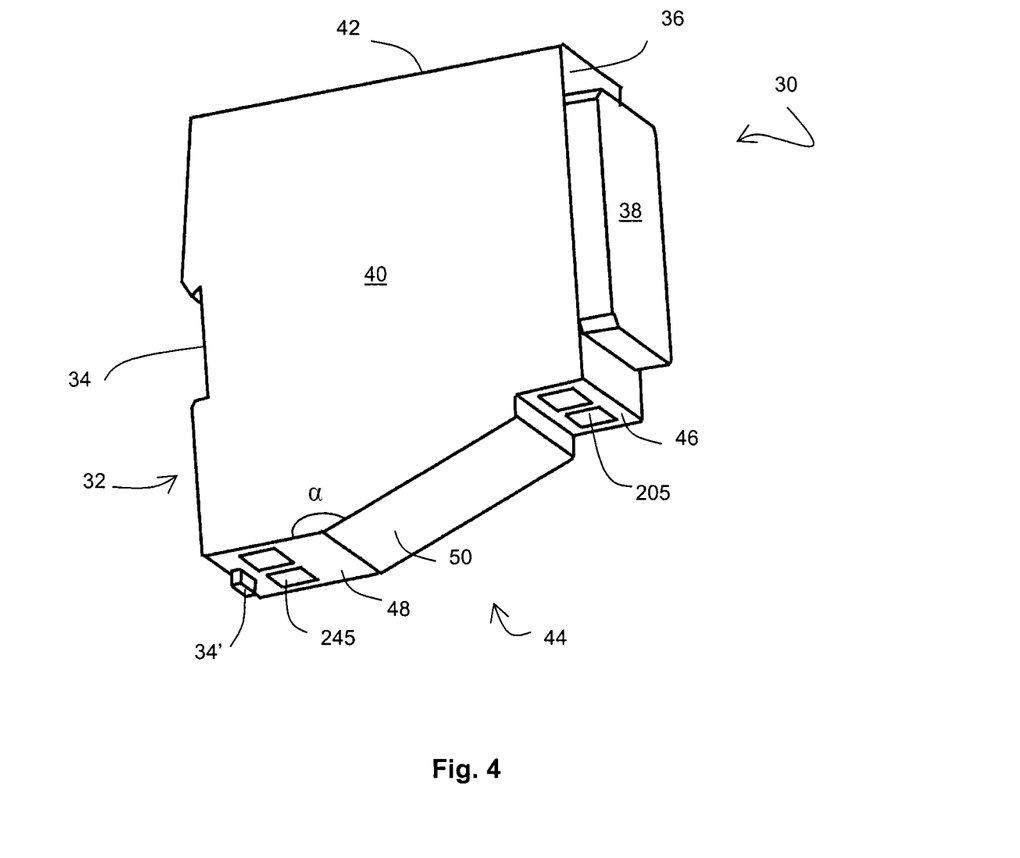
FIG. 4 shows the general form of a telecontrol equipment module casing according to a preferred embodiment of the invention.

In particular, the modules 200, 300, 400 all have a similar profile, based on that of the different known electrical devices fitted on DIN rails. It does, however, appear that the modules 200, 300, 400 must preferably be adapted to show a human/machine interface, and to allow a significant number of connections. Notably, as illustrated in FIG. 4 and according to a preferred embodiment, in order to increase the connection surface area, the profile of the casings 30 of the modules 200, 300, 400 is not rectangular, but comprises an oblique portion.

More specifically, the general form 30 of the casings of modules 200, 300, 400 comprises a back wall 32 provided with means 34 for fixing on a rail, notably on the DIN rail 140 of the power supply module 100, a front wall 36, opposite the back wall 32 and intended to display information, notably to accommodate the human/machine interface 38 of the module, and two similar side walls 40 intended to be attached together. The top wall 42 can be located directly under the wall of a cabinet 20 (see FIG. 1B) and is preferably horizontal. As specified above, it is advantageous for the distance separating two side walls 40 of each casing 30 to be a multiple of one and the same value, notably to observe a pitch of 45 mm; moreover, to satisfy the maximum footprint criteria of the prescribers, and by taking into account the thickness of the power supply module 100 which is added thereto, it is preferable for the distance separating the back wall 32 from the front wall 36 to be less than 140 mm; the height of the casing, corresponding to that of the back wall 32, is advantageously of the order of 140 mm, which leaves sufficient access to the apron 112 of the power supply module 100, whether for the connections or for displaying the interface specific to said module 100.

The bottom wall 44 is more specifically intended for the connections. In order to increase its surface area and facilitate said connections, according to a preferred embodiment, the bottom wall 44 is in three parts. A front part 46, substantially horizontal, is provided with the connection terminals 205 for the daisy chain, preferably located at a constant distance from their respective edge at the level of the corner with the side wall 40: particularly if the connectors 210 illustrated in relation to FIG. 2 are used, the connection is easy. A bottom part 48, also substantially horizontal, comprises the access to a locking pull tab 34' for the means 34 for fixing onto a rail and the connection terminals 245 for the power supply. Between the bottom part 48 and the front part 46, the intermediate part 50 is preferably oblique, which increases its length, and is used for the connections specific to the modules 200, 300, 400.

The volume of the casing 30 has to remain significant to house the various functional elements, and preferably the angle α between the bottom part 48 and the intermediate part 50 of the bottom wall 44 is of the order of 160°. The front wall 36 is of sufficient length to be able to insert therein a readable human/machine interface 38, notably 77.5 mm high. In an advantageous embodiment, the front wall 36 and the human/machine interface 38 form part of a functional assembly, or nose, 52, which is clipped onto the rest of the casing once the latter is assembled: see also FIG. 5B.

Thus, in the preferred embodiment, two DIN rails 124 suitably spaced apart (for example with a center-to-center distance of 100 mm) serve as wall mount. The power plant 100 is hooked onto the top rail and is then fixed using a lock 130 secured to the metal base 116 of the casing 110 onto the bottom rail. Once fixed onto the mount, the power supply module 100 can then accommodate, on its DIN rail 140 situated on the front face 134, the various modules 200, 300, 400 of the equipment item 10 according to the invention.

If the number of modules exceeds the accommodation capacity of said rail 140 (advantageously 6 times the pitch, i.e. one double module 200 and four monitoring modules 300$_i$, 400$_j$), it is possible to add another DIN rail directly onto the wall mount, either in extension of the power supply module 100, or below.

The power plant 100 is then connected to its power sources 4, 105, to the external communication means that it is likely to power, to the motorizations of the switches 5 to be powered and controlled, as well as to the other modules 200, 300, 400 of the telecontrol equipment item 10; as indicated, preferably, the power plant 100 is connected to supply power only to the communication module 200, which will transmit the energy step by step preferably by a jumper system 240. The power plant 100 is moreover linked to said communication module 200 by a dedicated Modbus link 180 for the exchanges of specific information concerning the monitoring and the control inherent to the telecontrol equipment item 10.

In fact, it is the second module 200 which links the monitoring modules 300, 400 together and with the outside world: this element 200 interacts in the upstream communication (to a SCADA control center 8, to a technician, to a storage system) but also in the downstream communication, that is to say the communication between monitoring modules 300, 400, with the power plant 100, with third party equipment items 5, 9 in the substation 6.

As in the conventional telecontrol offerings for the management of MV electricity networks 3, the communication means 200 can use a number of media (Ethernet, USB, GPRS, 3G, radio, etc.) and a number of protocols (according to IEC standards, or Modbus/TCP, or even in cyber-security mode conforming to the IEC 62351 standard), in order to give access to the remote measurements and information, and to pass commands to the switches 5 with a view to reconfigurations (following a fault, a change of operating scheme on maintenance, a load shedding of feeders before overloading of a transformer, etc). The communication means 200 implemented can manage the remote communication to the control center 8, the local communication for on-site configuration requirements, for maintenance, or even the exchanges with other equipment items situated in the same substation 6, like a gateway, with, notably, a mesh for the internal exchanges of the product 10.

Here also, the communication means are housed in one and the same casing 250 forming a communication module 200, the profile of which will be similar to that of the other modules in accordance with FIG. 4, and the width of which is conventionally greater than the pitch, notably 90 mm.

In fact, according to a preferred embodiment, the functions ensured by the communication module 200 are separated into two blocks: the upstream communication which concerns the transmission of the information notably to a centralized management system 8 or to a radio 24 or similar, and the rest, assimilated to downstream communication, which thus concerns all the communication between the modules of the telecontrol equipment item 10 and with the elements of the MV/LV substation 6.

Figure 5A:
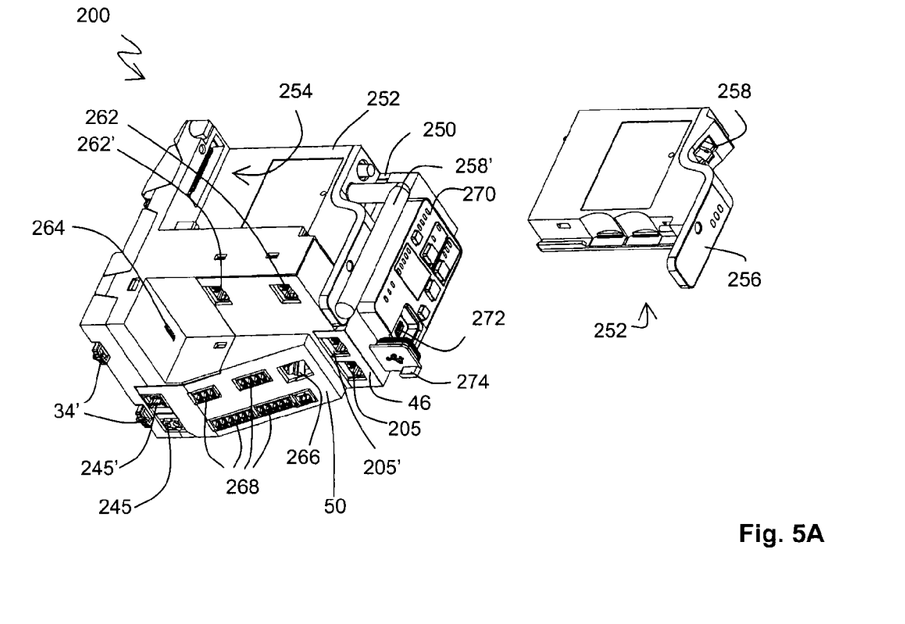
FIGS. 5A and 5B represent a telecontrol equipment communication module according to a preferred embodiment of the invention.
Figure 5B:
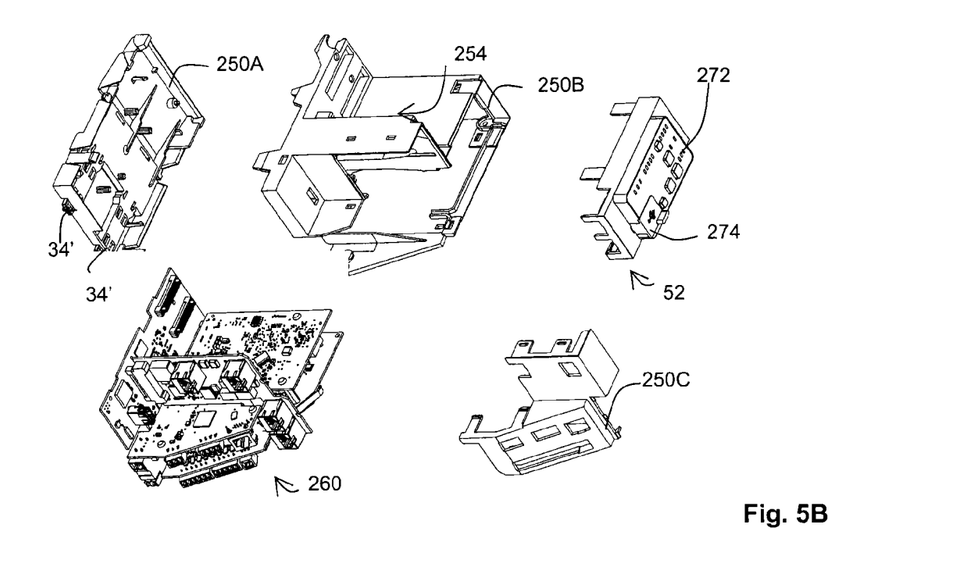

The upstream communication is determined by the client of the equipment power item 10, according to his or her choices of protocol and of medium (such as, for example, a communication by public switched telephone network, or GSM, or radio; 3G or FSK communication) and can change with the updating of the protocols or dedicated switchgear. According to a preferred embodiment of the invention, the elements relating to the upstream communication, that is to say, in the end, the "translation" for transferring the data in reception or in transmission, are implemented in cassettes 252 that can be removed from the communication module 200. Thus, depending on the layout of the equipment item 10 and/or its updating, an appropriate cassette 252 is chosen, inserted into a suitable housing 254 of the casing 250 so that the communication can immediately be ensured according to the right protocol. The cassettes 252 comprise the means necessary to their function, associated, according to the case, with insulations, and preferably a human/machine interface 256 that are similar to one another, notably indicating a communication fault, transmission and reception, and certain specific functions (like an attachment light-emitting diode for the GSM cassette), a wired connection means 258 or possibly an antenna 258'. Advantageously, the casing 250 of the communication module 200 comprises two slots 254 for the insertion of a cassette 252, one of which can remain unused, thus increasing the width of the module 200 but allowing greater flexibility and versatility of use, while offering a possibility of redundancy in the event of failure of one of the media.

For its part, the downstream communication is implemented by appropriate electronic means, in particular an assembly 260 of electronic boards for example each dedicated to functions or blocks of functions. Preferably, in order to allow for an adaptation of the communication means 200, even of the monitoring 300, 400 and power supply 100 modules which are linked thereto, the electronic assembly 260 comprises a microprocessor adapted to provide various services and that can be updated and/or reconfigured from the outside.

In particular, the assembly of boards 260 bears means suitable for:
  managing updates;
  managing interruptions and failures (startup, tests, post-failure analysis);
  managing power supplies, inputs/outputs, including external lamps and any temperature probes, human/machine interfaces, as well as power, making it possible to control the consumption of the module and the information given;
  implementing cyber-security;
  managing the communication cassettes 252;
  implementing ancillary communication, such as WiFi or USB or Ethernet local area network (LAN) communications to, for example, a basic web server supplying an overview of the internal data of the module for installation or maintenance, or to a "slave" device to be managed;
  and of course communicating with the other modules 100, 300, 400 of the telecontrol equipment item 10.

The arrangement of the boards of the assembly 260 is produced by being incorporated in a casing 250 of which a part has to be able to remain "empty", forming the housings 254 for receiving the cassettes 252 which may or may not be delimited by casing walls. The casing 250 is thus clipped together in a number of parts 250A, 250B, 250C around the electronic assembly 260, preferably with a removable interface nose 52. The connection means of the electronic assembly 260 emerge from the casing through the oblique side 50 mentioned above; in light of the presence of the housings 254, said oblique connection side 50 may be present only over a part of the thickness of the module 200 in extension of the nose 52 and of the human/machine interface; the other part, situated at the level of the cassettes 252, may be simplified, and is intended rather for the connections to third party equipment items 262 or to a wide area network WAN 262', independent of the specific operation of the telecontrol equipment item 10. A USB port 264 can moreover be provided, to extend the memory of the microprocessor or for a video camera: the one-off connection is preferably placed on a part of the assembly of boards 260 accessible at the level of the housings 254 for cassettes 252.

Apart from the wireless communication means, such as a WiFi connection, and possibly with the exception of the wired connection means 262, 264 to third party equipment items, the connection and display means of the electronic assembly 260 preferably all emerge from the casing 250 on its bottom face 44, with, notably: the Modbus port 266 for the link with the power plant 100, inputs/outputs 268 for sensors (such as a temperature probe or a door sensor) or relays, etc.

The two communication 205, respectively power supply 245, ports common to the modules 200, 300, 400 are placed on the front part 46, respectively bottom part 48, of the bottom wall 44, at least one of the ports 205, 245 located at a predefined distance from the edge of the casing 250 which will come to be placed side-by-side with a monitoring module 300, 400 in order to use the connection jumpers 210, 240; the second communication port 205' is intended to close the communication loop by an Ethernet cable and the second power supply port 245' is intended for a connection with the power plant 100: they can therefore be situated at a different distance, the connection jumpers 210, 240 not being able to be used. It appears advantageous here for the part of the casing comprising the slots 254 to be the part situated at the head of the row of the telecontrol equipment item 10.

The human/machine interface 270 of the communication module is adapted to enable the user to view the status of the different functionalities implemented in and by the communication module 200, notably via light-emitting diodes, such as the status of the communication functions (presence of WiFi, alarm, etc.), the status of the main functions of the power supply module 100 (presence of the different voltages, battery fault, etc.), the operation of the other modules, etc. Pushbuttons allow for activation or deactivation, as well as the manual execution of automation network functions such as source switchover devices.

Furthermore, the communication module 200 according to the preferred embodiment is configured to be able itself to communicate with an external tool allowing for an updating of the software and certain configurations: a USB port 272 for the connection of a configuration tool is incorporated, preferably on the front face and the human/machine interface 270. Advantageously, the USB port 272 is concealed by a removable and captive flexible seal 274. Some of the diodes may possibly be configurable via the microprocessor via the USB port 272.

This functionality offered by the USB port 272 and the reconfiguration also allows for the remote recovery of data such as event, alarm, measurement logs, for the purpose of diagnostics following events on the electrical network, which also offers possibilities for the tracking and hardware management of the installed base. This option, as well as the choice of upstream communication cassettes 252, makes it possible to upgrade the communication module 200, and more generally the telecontrol device 10, in line with technological advances (such as the definition of new communication protocols), customer requirements (such as to Smartphones), but also in line with architectural modifications to the network 1, by being able to take into account the addition of new monitoring 300, 400 or other modules. Although open to these future changes, the offering remains reliable and safe, notably in terms of cyber-security, by virtue of the fact that all the communications pass the dedicated module 200.

In fact, in addition to the communications to the outside and the power supply module 100, the communication module 200 of course manages the information necessary for the telecontrol of the MV network 3. It receives the data collected by the MV monitoring module(s) 300 and transmits to them any information necessary to the management of the network 3: in fact, a telecontrol offering is intended to detect malfunctions, notably of short-circuit type, in the MV network(s) 3, and intervene on the network through at least one switch 5, in order, for example, to isolate the failed section of the network, and reconfigure the network 3 to minimize the number of clients affected by the incident. In particular, when the switches 5 are motorized, the power supply module 100 is adapted to power their operation (via, for example, a transformation and a 24 or 48 V connection) just as the communication module 200 can send the indication to the monitoring module 300 concerned for an actuation; alternatively, the power supply could be produced via the control/command module 300 or the communication module 200 subject to a 24 or 48 V power supply link, for example also in daisy-chain configuration.

More generally, a telecontrol equipment item comprises MV control/command means suitable for producing the functions required on the lines, that is to say one of the lines comprising one of the switches 5 as illustrated in FIG. 1A, that they monitor via links with MV sensors 7 which are placed thereon, namely:

detection of faults of short-circuit type (phase-phase or phase-earth);
management of the presence/absence of networks;
management of setting of the switch 5;
control (local or remote) of the switch 5 to close and open;
possible taking into account of network automation functions such as an automatic power source changeover PASA or a decentralized alarm automation function (ADA);
monitoring of the MV currents and voltages, powers and energies.

Figure 6:
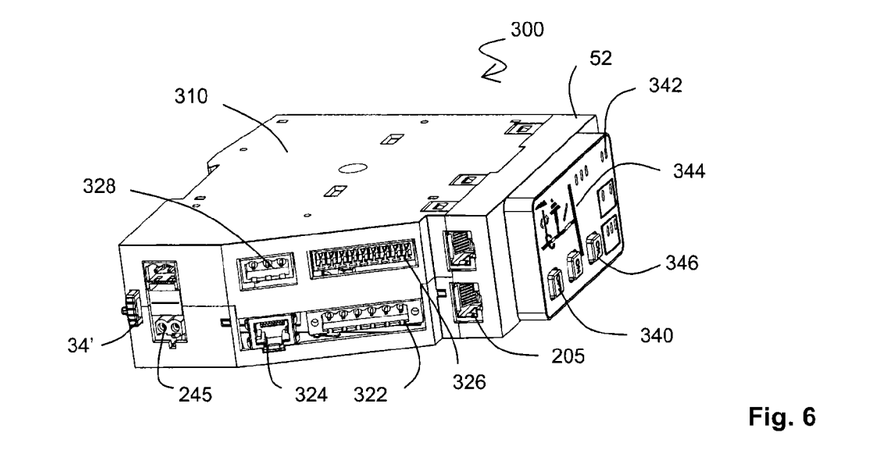
FIGS. 6 and 7 show monitoring modules for the MV and LV network for a telecontrol equipment item according to a preferred embodiment of the invention.

According to the preferred embodiment of the invention, to make best use of the modular architecture of the telecontrol equipment item 10, each control/command module 300 monitors only one line: this facilitates the connections by avoiding connection errors; furthermore, although the usual prescription is conventionally 4 lines (with a main incomer and a backup incomer to an MV/LV substation 6 as well as a feeder to a subsequent substation and possibly one to another substation), in the end, few lines are used in practice which results in a bulk and a cost that are pointless with the devices providing for this default prescription. Furthermore, the casings 310 of the single-line MV control/command modules 300 are sufficiently narrow to be able to easily align three/four of them on the power supply module 100 if necessary.

Moreover, it is known that the means and methods for detecting faults depend on numerous factors: overhead or underground network, three- or four-wire network, earthing of the neutral of the network, existence of a secondary network, presence or non-presence of MV current and/or voltage sensors 7. Furthermore, the very type of the sensors 7 varies according to the networks 3, just as the switches 5 may be motorized or not. According to the preferred embodiment of the invention, the electronic means for processing the signal picked up by the monitoring module 300 are adapted to be configured according to the network in which they are located: they can comprise one or more fault detection algorithms, preferably from among those described in the documents EP 2169799 or EP 2687860, for example, with means for selecting at the time of installation; alternatively, the algorithms can be updated via a link such as a USB port accessible by removing the nose 52, or via the communication module 200.

The microprocessor specific to the function of the MV monitoring module 300 advantageously uses a system identical to that of the communication module 200, notably with respect to the configuration managers, power, test, updating, maintenance for analysing the failures.

In particular, the electronic means comprise a current board with suitable connection means 322, a voltage board with suitable connection means 324, and a switch control board 5 provided with suitable connection means 326, possibly associated with control means for the associated motor 328. The means for determining the switch control, that is to say fault detection, can be the object of a dedicated board, or be located in the control board, or another solution; a connection for the updating/selection can be provided directly on the MV control/command module 300 (notably by removing the nose 52) or via the communication module 200. In fact, of course, the casing 310 also houses the elements adapted for the power supply 245 and the communication 205, notably by daisy-chaining.

The MV monitoring module 300 also comprises a human/machine interface, preferably associated with a nose 52 of a casing 310. The human/machine interface 340 is adapted to allow the user to view the status of different functionalities implemented in and by the MV monitoring module 300, notably via light-emitting diodes 342, such as states, alarms, network automat, local or remote control statuses, etc. The human/machine interface 340 preferably schematically represents the network 344 by indicating the statuses of the various elements (earth main switch, switch, voltage presence) by means of colour. Pushbuttons 346 make it possible to activate or disable, and manually execute local commands on the associated MV switch 5. Some of the diodes 342 can possibly be configurable via the microprocessor via the USB port or via the communication module 200.

Thus, the telecontrol equipment item 10 comprises standardized monitoring and even control modules 300, which are adaptable to any network 1, 3 in a simplified manner, whether in terms of the number of modules $300_i$ to be used or of the fault detection and control/command system to be implemented.

Moreover, the telecontrol equipment item according to a preferred embodiment of the invention also makes it possible to monitor the LV network 4. In fact, in the field of the telecontrol of electrical distribution networks 1, only the management of the MV network 3 is usually considered, the issues being primarily the continuity and the quality of distribution: since a fault in LV 4 affects only a very limited number of clients, unlike the same fault in MV 3, only a passive observation of the LV network 4 is sometimes implemented, more often than not by the aggregation of the data the client counters issue. It is however apparent that, in light of the issues concerning energy efficiency, the integration of dispersed renewable energies, the balancing of the phases or the management of the LV voltage plan may become crucial.

Figure 7:
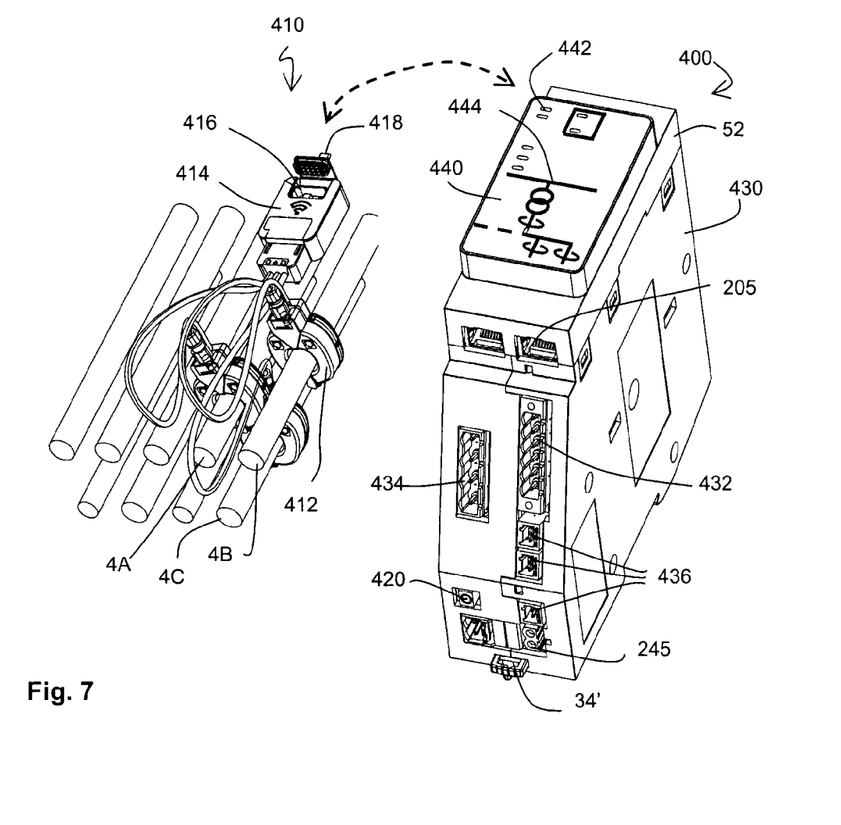

The coexistence within one and the same product of the MV and LV functions is conventionally excluded for insulation reasons: typically a 10 kV insulation is required between the MV and LV sets. In the telecontrol equipment item 10 according to the invention, the LV network 4 monitoring functions are incorporated by using standalone LV sensors 410 which communicate wirelessly, preferably according to the ZigBee protocol. Thus, the insulation between the groups of modules forming the architecture is observed. As illustrated in FIG. 7, the sensors 410 used are preferably in the form of triplets of opening toroids 412, each of which can be installed without interrupting the network on one of the cables of the line, by being notably adapted for 4A, 4B, 4C cables up to 27 mm. Preferably, the three toroids 412 of a set of sensors 410 are associated with a communication base 414, which can also comprise a display interface 416, for example to check the status of the Zigbee communication. Advantageously, the elements specific to the configuration for the wireless data exchange pairing via the Zigbee protocol and the access points during tests in production are masked under a removable seal 418.

The data from a set of sensors 410 are transmitted to the LV monitoring module 400 which thus comprises ZigBee reception means 420 internal to its casing 430; preferably, the LV monitoring module 400 further comprises means 432 for connection to a wired current sensor 9' monitoring the currents of the secondary of the MV/LV transformer, in order to ensure a continual measurement thereof to allow the transformer monitoring functions, unlike the sensors 410 which can exhibit a possible discontinuity of measurement communicated to the module 400, because of a current level insufficient to guarantee the self-powering.

To fulfil its functions, the LV monitoring module 400 also comprises means 434 for connection to a voltage sensor of the LV network 4, and preferably means 436 for connection to temperature probes. In fact, the control/command module of the LV network 400, in addition to serving as Zigbee communication gateway for its sensors 410, is adapted to fulfil some, or all, of the following functions:

management of the sensor 410;

measurements of currents, voltages, powers (or power factor) and energies (active, reactive and apparent; total and per phase) in accordance with the norms indicated on the LV 4 incomer and feeders, for a better management and a better balancing of the load plan;

detection of cut neutral, of presence/absence of voltage, of a blown LV fuse;

monitoring of the balancing of the loads;

recording of the waveforms;

indication of an LV fault transition of short-circuit type, whatever the cable 4A, 4B, 4C and for any earthing system;

MV detection of a resisting earth fault or of a broken conductor according to the principle described in the document FR 2976363 for example;

measurement of the real LV frequency.

To this end, the LV monitoring module 400 houses, in its casing 430, in a form similar to that of the LV monitoring casing 310 and of course comprising the connection means 205, 245 for the communication and power supply daisy-chainings, and possibly a USB update port, accessible notably by removing the nose 52, and electronic means, notably in board form, suitable for fulfilling the above functions.

The electronic means of the LV monitoring module 400 can be adapted to be updated or modified by virtue of a microprocessor as described in relation to the MV module 300, also via a direct communication by the communication module 200. In addition to these functionalities specific to the LV monitoring module 400, the electronic means in fact comprise, as for the MV monitoring module 300, means for starting the module 400, means making it possible to manage updates and configuration of the processor, means for reacting to a hardware failure, via a self-test, means for monitoring the consumption of the module relative to the power supply mode (battery 105 or network 4) of the equipment 10, means for analysing, after failure, the internal events and giving a diagnosis, means for communicating with the other modules, even means for giving a remote server an overview of the internal data of the module 400.

Among the functions to be implemented, it is also possible to give information on the transformer of the substation 6, information which will be communicated to the central manager 8, like the measurement of its temperature, the prediction of its end of life by monitoring temperature and load, control of the position of its setting by monitoring the LV voltage level.

Furthermore, by virtue of the implementation of the measurement and the monitoring of the LV and MV currents within the same telecontrol equipment item 10, the detection of a blown transformer fuse is facilitated, the LV and MV currents being available directly via the communication 205: this detection can be implemented in the LV module 400 and/or MV module 300 or directly in the central controller 8.

Preferably, the electronic means are adapted to synchronize the signals from the reception means 420 in order to be able to manage the plurality of feeders, and for example implement the method described in the patent application FR 13 61222 allowing for the monitoring of powers and of energies on the plurality of LV feeders with a single voltage measurement. Thus, it is possible to concentrate the control of a plurality of LV lines on the same module 400.

Moreover, if the incomer of the LV panel and/or the feeders 4 are equipped with switches and circuit breakers 9, it may be possible to control them via a dedicated communication, for example by the daisy-chain or integrated commands via the communication module 200. The LV control/command module 400 finally also comprises a human/machine interface, preferably associated with a nose 52 of a module 430. The human/machine interface 440 is adapted to allow the user to view the status of the different functionalities implemented in and by the LV monitoring module 400, notably via light-emitting diodes 442, such as states, alarms, Zigbee communication status, etc. The human/machine interface 440 preferably schematically represents the network 444 by indicating the status of the various elements (earth switch, switch, presence of voltage) by means of colour. Preferably, the human/machine interface 440 of the low voltage module 400 takes the same form as the interface 340 of the MV module 300, except for the pushbuttons 346, in order to simplify the interpretation of the data by the user.

Thus, by virtue of the technological choices according to the preferred embodiment, it is possible to incorporate a function for monitoring up to twelve three-phase outgoing LV feeders in a telecontrol equipment item 10 with a single LV monitoring module 400. The problems of insulation are notably resolved by the use of wirelessly communicating self-powered sensors.

More generally, the different options taken in the preferred embodiment make it possible to provide a telecontrol equipment item 10 that satisfies the new issues of the modern and "intelligent" electrical distribution networks 1 (or "smart grids"). The modular offering presented facilitates consistency of range between the different application contexts (underground versus overhead network, inclusion of the distributed energy resources, supervision extended from the MV domain to the LV domain, etc.), while retaining upgrade possibilities, at both software and hardware levels. The choices of software and hardware modularity are reflected in the mechanics of the various constituent elements, but also their arrangement (distribution of the power supply for example) and their inter-operability (exchanges of information between modules).

In particular, the telecontrol equipment item 10 comprises power supply means 100, communication means 200, MV monitoring means 300 and LV monitoring means 400. Each of these means 100, 200, 300, 400 is preferably housed in a functional casing 110, 250, 310, 430, these modules being in the DIN format and having the same profile 30 for those which are aligned, thus facilitating their assembly and optimizing the wiring of the connection system of the solution, which is advantageously done by Ethernet jumpers 210 that are similar to one another for most of the connections: the solution is neither fixed nor constrained by a cabinet 20, while being considered as "ordinary" in the implementation.

Figure 8:
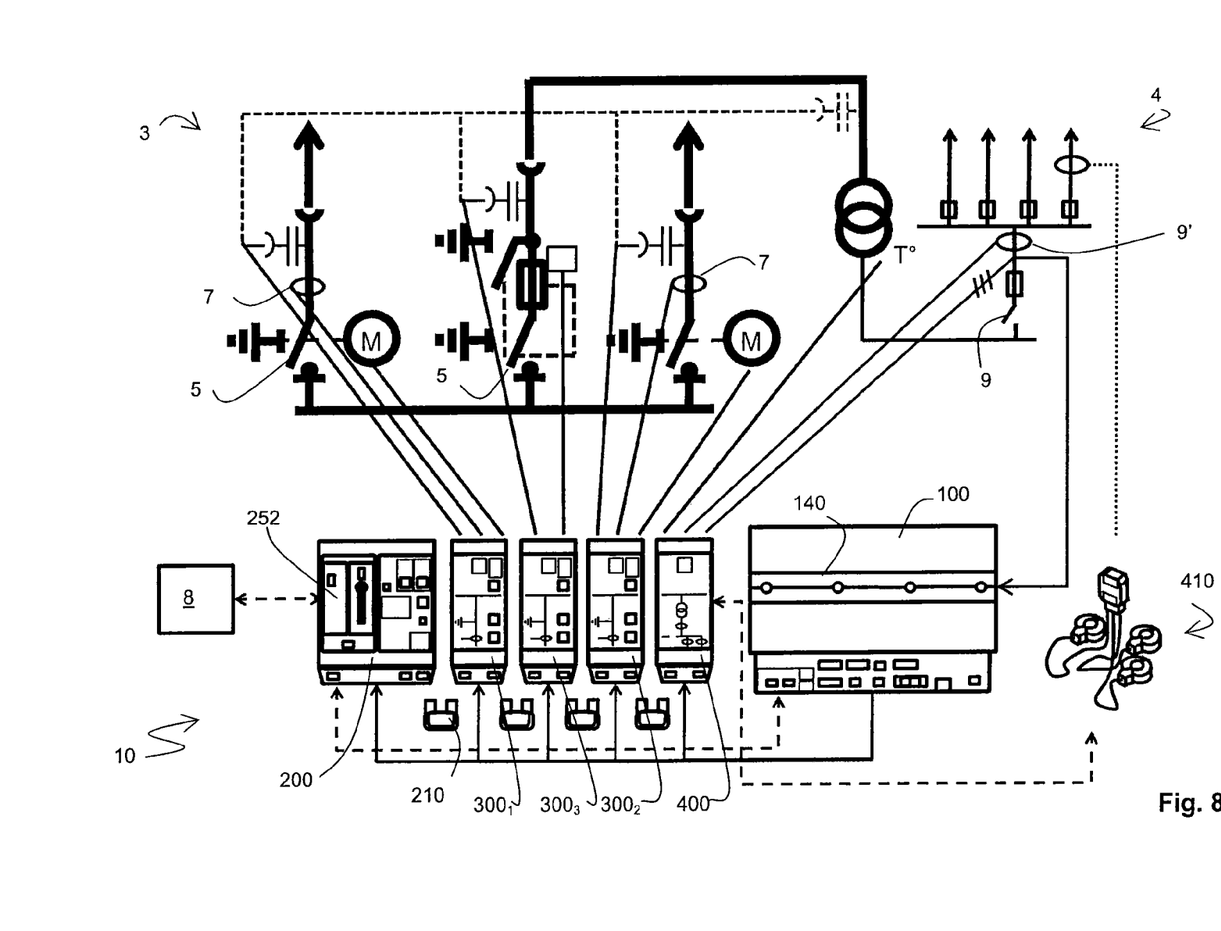
FIG. 8 schematically illustrates an equipment item according to one embodiment of the invention installed on an MV/LV substation to be monitored.

Notably, the solution proposed and illustrated in an embodiment in FIG. 8 hinges around:
- a power plant 100 which powers all of the functions (electronics, radio/GSM, motorization of the switches) with the requisite voltage level, from the LV network 4 and from an auxiliary source ensured by a battery 105 for which it handles the management (charging, monitoring); the casing 110 of this power plant 100 serves as a mechanical support for the other modules, by incorporating a DIN rail 140 on the front face;
- a communication module 200, which connects the modules to one another, but also with the outside world (to the control center 8, to the "cloud" and data storage applications for monitoring, to a computer for technical personnel, to a third party equipment item in the substation 6, etc.); this module supports different types of communication and different protocols, and ensures the functions of cyber security; it further supports the database, and the system functionalities through a programmable logic automatic workbench;
- at least one module 300$_i$ for control and command of MV switches 5 which supports all the functions relative to an MV outgoing feeder 3;
- at least one LV monitoring module 400 associated with a unit of self-powered and wirelessly communicating sensors 410, or several.

The power supply for the modules 200, 300, 400 as well as the communication between them are preferably conveyed by daisy-chaining, which further increases the upgrade and adaptation possibilities, while facilitating the installation and implementation. The requirements concerning cyber-security and the encryption of the data can thus be directly incorporated in the communication module 200 which manages all the exchanges. Furthermore, the different means for implementation of the control, monitoring, command, and communication are provided to be able to be adapted to the needs of the client on site, according to the network (including if it is a two-way network) by virtue of software facilities, and updated via a common platform, notably a processor in the communication module 200 which can be connected to any configuration tool, such that the equipment item 10 can incorporate new functionalities developed during its lifetime. From installation, the equipment item 10 comprises preferably in all cases, the means for using the different media and communication protocols available, by offering a better bit rate, an increased bandwidth and possibilities of redundancy in the event of failure of a communication network. The connection with third-party equipment is provided, as is an increased storage of the data (measurements, logging of the events, of alarms), locally and/or remotely, via transfers and periodic backups.

In the preferred embodiment, furthermore, an optimized management of the consumption of the equipment item 10, through the use of "energy saving" modes on the microprocessors or the use of self-powering principles, is incorporated. Furthermore, the electronic systems implemented in the different modules 100, 200, 300, 400 can take into account the definition of localized control logics, in order to ensure new curative functionalities (such as self-healing following a fault) or preventive functionalities (such as load shedding in the event of consumption peaks, or the possibility of relying on nearby decentralized production to relieve the main network), without necessarily having to systematically report back to the control center 8.

Although the invention has been described with reference to an optimized telecontrol equipment item, it is not limited thereto: the different options implemented in the preferred equipment item can be adapted to other electrical devices, and the telecontrol equipment item can comprise variants for certain preferred elements.

The invention claimed is:

1. An electrical power supply module for telecontrol equipment comprising a casing housing electronic means which:
   comprise means for connecting to a low-voltage network, means for connecting to a battery, connection means for powering electronic modules, and
   are adapted to transform the energy of the network and of the battery to which they can be connected into power supply energy for the electronic modules to which they can be connected,
wherein the casing:
   comprises a support face intended to be fixed onto a wall mount, and
   is closed for a first part by a cover having a front face opposite the support face and provided with fixing means for electronic modules, and, for the second part, by a cap comprising orifices from which the connection means of the electronic means are accessible.

2. The electrical power supply module according to claim 1, in which the cover and the support face are metallic, the cap is insulating.

3. The electrical power supply module according to claim 2, comprising means for insulating the electronic means relative to the cover and to the support face.

4. The electrical power supply module according to claim 1, in which the electronic means comprise a printed circuit board which is housed parallel to the support face in the casing.

5. The electrical power supply module according to claim 4, in which the printed circuit board further comprises a communication port, the cap comprising an orifice for access to said port.

6. The electrical power supply module according to claim 5, in which the printed circuit board further comprises display means, the cap comprising orifices adapted for said display means.

7. The electrical power supply module according to claim 1, in which the fixing means of the front face of the cover comprise a DIN rail.

8. The electrical power supply module according to claim 1, in which the support face comprises fixing means with two parallel rails.

9. The electrical power supply module according to claim 8, in which the fixing means comprise snap-fitting means on a first rail and locking means on the second rail.

10. The electrical power supply module according to claim 1, in which the cover comprises two side walls provided with ventilation louvers.

11. A telecontrol equipment comprising a power supply module according to claim 1 and at least one monitoring module for a medium-voltage network, said monitoring module being installed on the front face of the cover of the power supply module via the fixing means and being linked to the power supply module via the connection means for powering electronic modules of the power supply module.

12. A telecontrol equipment according to claim 11, further comprising a communication module installed on the front face of the cover of the power supply module via the fixing means and connected to the connection means for powering electronic modules of the power supply module, said communication module being also linked to the monitoring module such that the link between the monitoring module and the power supply module is in the form of a series connection via the communication module.

13. A telecontrol equipment comprising a power supply module is according to claim 5, wherein the communication module is linked to the power supply module via a communication port.

* * * * *